US011005025B1

(12) United States Patent
Horsley et al.

(10) Patent No.: US 11,005,025 B1
(45) Date of Patent: May 11, 2021

(54) PIEZOELECTRIC MICROMACHINED ULTRASONIC TRANSDUCERS WITH LOW STRESS SENSITIVITY AND METHODS OF FABRICATION

(71) Applicant: Chirp Microsystems, Inc., Berkeley, CA (US)

(72) Inventors: David Horsley, Berkeley, CA (US); Andre Guedes, San Francisco, CA (US); Stefon Shelton, Oakland, CA (US); Richard Przybyla, Emeryville, CA (US); Meng-Hsiung Kiang, Berkeley, CA (US)

(73) Assignee: CHIRP MICROSYSTEMS, INC., Berkeley, CA (US)

( * ) Notice: Subject to any disclaimer, the term of this patent is extended or adjusted under 35 U.S.C. 154(b) by 1000 days.

(21) Appl. No.: 15/625,421

(22) Filed: Jun. 16, 2017

Related U.S. Application Data

(63) Continuation of application No. PCT/US2015/066906, filed on Dec. 18, 2015.

(Continued)

(51) Int. Cl.
| | |
|---|---|
| *H01L 41/04* | (2006.01) |
| *H01L 41/047* | (2006.01) |
| *H01L 41/053* | (2006.01) |
| *H01L 41/18* | (2006.01) |
| *H01L 41/31* | (2013.01) |

(Continued)

(52) U.S. Cl.
CPC .......... *H01L 41/047* (2013.01); *B06B 1/0651* (2013.01); *H01L 41/053* (2013.01); *H01L 41/18* (2013.01); *H01L 41/253* (2013.01); *H01L 41/29* (2013.01); *H01L 41/31* (2013.01)

(58) Field of Classification Search
CPC ... B06B 1/0651; H01L 41/047; H01L 41/053; H01L 41/18; H01L 41/253; H01L 41/29; H01L 41/31
See application file for complete search history.

(56) References Cited

U.S. PATENT DOCUMENTS 2,910,545 A 10/1959 Glenn
5,956,293 A * 9/1999 Rorick ................... G10K 9/122
310/326

(Continued)

FOREIGN PATENT DOCUMENTS

WO 2014134723 A1 9/2014
WO WO-2016106153 A1 * 6/2016 ......... G01N 29/2437

OTHER PUBLICATIONS

Examination Report dated Jul. 8, 2019 for European Patent Application No. 15874212.2.

(Continued)

*Primary Examiner* — J. San Martin
(74) *Attorney, Agent, or Firm* — JDI Patent; Joshua D. Isenberg; Robert Pullman

(57) ABSTRACT

A piezoelectric micromachined ultrasonic transducer (pMUT) device may include a piezoelectric membrane transducer designed to have lower sensitivity to residual stress and reduced sensitivity to geometric variations arising from the backside etching process used to release the membrane. These designs allow some of its key feature to be adjusted to achieve desired characteristics, such as pressure sensitivity, natural frequency, stress sensitivity, and bandwidth.

26 Claims, 15 Drawing Sheets

Related U.S. Application Data

(60) Provisional application No. 62/095,048, filed on Dec. 21, 2014.

(51) Int. Cl.
*H01L 41/253* (2013.01)
*H01L 41/29* (2013.01)
*B06B 1/06* (2006.01)

(56) References Cited

U.S. PATENT DOCUMENTS

| | | |
|---|---|---|
| 6,249,075 B1 | 6/2001 | Bishop et al. |
| 2001/0035700 A1 | 11/2001 | Percin et al. |
| 2007/0195976 A1 | 8/2007 | Sekino et al. |
| 2007/0284682 A1* | 12/2007 | Laming ............... H04R 19/005 257/416 |
| 2009/0185700 A1 | 7/2009 | Suzuki |
| 2010/0327695 A1* | 12/2010 | Goel ..................... B06B 1/0622 310/320 |
| 2010/0327702 A1 | 12/2010 | Martin et al. |
| 2012/0074509 A1 | 3/2012 | Berg et al. |
| 2017/0021391 A1* | 1/2017 | Guedes ................ B06B 1/0603 |
| 2017/0069820 A1* | 3/2017 | Hada ..................... H01L 41/29 |
| 2019/0193116 A1* | 6/2019 | Horsley ................ G10K 9/122 |
| 2019/0336099 A1* | 11/2019 | Fife .................... G01N 29/2406 |
| 2020/0168785 A1* | 5/2020 | Ikeuchi ................ H01L 41/319 |
| 2020/0194658 A1* | 6/2020 | Guedes ................ B06B 1/0607 |

OTHER PUBLICATIONS

Extended European Search Report dated Jul. 18, 2018 for European Patent Application No. EP15874212.

Suedes A et al: "Aluminum nitride pMUT based on a flexurally suspended membrane", 2011 16th International Solid-State Sensors, Actuators and Microsystems Conference (Transducers 2011); Beijing, China; Jun. 5-9, 2011, IEEE, Piscataway, NJ, Jun. 5, 2011 (Jun. 5, 2011), pp. 2062-2065, XP031910565, 001: 10.11 09/TRANSOUCERS.2011.5969223 ISBN: 978-1-4577-0157-3.

International Search Report and Written Opinion dated Apr. 19, 2016 for International Patent Application No. PCT/US2015/066906.

Muralt P et al: "Study of PZT coated membrane structures for micromachined ultrasonic transducers", 2001 IEEE Ultrasonics Symposium Proceedings. Atlanta, GA, Oct. 7-10, 2001; [IEEE Ultrasonics Symposium Proceedings], New York, NY : IEEE, US, vol. 2, Oct. 7, 2001 (Oct. 7, 2001), pp. 907-911, XP010584658, DOI: 10.1109/ULTSYM.2001.991867 ISBN: 978-0-7803-7177-4.

Stefon Shelton et al: "CMOS-compatible AIN piezoelectric micromachined ultrasonic transducers", Ultrasonics Symposium (IUS), 2009 IEEE International, IEEE, Piscataway, NJ, USA, Sep. 20, 2009 (Sep. 20, 2009), pp. 402-405, XP031654508, ISBN: 978-1-42444389-5.

* cited by examiner

PIEZOELECTRIC MICROMACHINED ULTRASONIC TRANSDUCERS WITH LOW STRESS SENSITIVITY AND METHODS OF FABRICATION

CLAIM OF PRIORITY

This application is a continuation of International Patent Application Number PCT/US2015/066906 filed Dec. 18, 2015, the entire disclosures of which are incorporated herein by reference. International Patent Application Number PCT/US2015/066906 claims the priority benefit of U.S. Provisional Patent Application No. 62/095,048 filed Dec. 21, 2014, the entire disclosures of which are incorporated herein by reference.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE DISCLOSURE

Micromachined ultrasonic transducers (MUTs) have been described in several publications and have been subject to extensive research in the last decades. A typical piezoelectric MUT (pMUT) includes a multilayer membrane structure that is excited into flexural vibration using piezoelectric actuation. The membrane structure may include a bottom layer 101, a piezoelectric layer 102, a top electrode layer 103 formed on the piezoelectric layer, and a bottom electrode layer 105 sandwiched between the bottom layer and piezoelectric layer. The bottom layer 101 may be a passive bending layer or a second piezoelectric layer. An opening 104 may be formed in the piezoelectric layer 102 to expose the bottom electrode layer 103 and allow for electrical contact thereto. The membrane structure is often formed by etching through a substrate 100 such as a silicon wafer to remove the material beneath the membrane, thereby allowing it to vibrate. This etch forms a hollow tube 106 beneath the backside of the membrane. The membrane vibrates in response to a time-varying driving voltage to generate a high frequency pressure wave in a propagation medium (e.g., air, water or body tissue). These devices typically operate at a specific resonance frequency, targeted to possess particular ultrasound characteristics and/or to satisfy a specific application. The desired resonance frequency can be easily tuned by selecting the correct materials and membrane dimensions. For most applications it is very important to assure good frequency matching between transducers fabricated on different wafers as well as between transducers fabricated on the same wafer. Resonance frequency variations in pMUTs mainly arise from micro-fabrication process variations, including but not limited to: residual stress gradients present in the structural materials, thickness variations, dimensional variations, and layer-to-layer alignment variations. A good metric to evaluate the frequency-matching yield of pMUTs fabricated across a number of wafers or within a single wafer is to assure that the total variation of the resonance frequencies of all the pMUTs is smaller than the average pMUT bandwidth (BW) at resonance. Keeping the frequency variation within the aforementioned range is crucial to produce maximum performance as well as to enable high manufacturing yield.

Another factor to be taken into account in the pMUT design is the incorporation of air vents in the pMUT membrane to equalize pressure. These air vents are crucial to avoid membrane rupture during particular packaging processes, where the interior or exterior side of the membrane might be subjected to abrupt pressure variations.

Accordingly, what is needed is a pMUT design and fabrication method that would overcome the above-identified issues, i.e., a pMUT with uniform frequency response across a micro-fabricated wafer, resulting from decreased dependency on manufacturing process variations; and a pMUT that includes air vents, to equalize pressure differences across the two sides of the pMUT's membrane. The design and the fabrication method should be easy to implement, cost-effective, and utilize existing chip and wafer fabrication technology. It is within this context that aspects of the present disclosure arise.

BRIEF SUMMARY OF THE DISCLOSURE

This present disclosure generally relates to micromachined ultrasonic transducers (MUTs) and more particularly to a design for a piezoelectric micromachined ultrasonic transducer (pMUT) device and a method to fabricate this device. The device includes a piezoelectric membrane transducer designed to have lower sensitivity to manufacturing process variations, in particular to two key parameters: (i) residual stress and stress gradients present in the active materials of the membrane, and (ii) geometric variations arising from the backside etching process used to release the membrane. The pMUT membrane includes an elastic layer and a piezoelectric layer sandwiched between two metal electrodes. The frequency variation caused by residual stress in the piezoelectric layer is minimized by including a ring-shaped top electrode and removing the piezoelectric material in the center of the membrane. Frequency variations caused by residual stress in the elastic layer are minimized by using an elastic layer that is in tension, e.g. a layer that has a positive stress level. The stress sensitivity is further reduced by adding perforations, e.g., slots) at the perimeter of the membrane. These perforations partially release the stress in the pMUT membrane, and also act as air vents to equalize pressure across the exterior and interior surfaces of the membrane. These perforations also function as etch holes that facilitate the final etch of the sacrificial oxide layer beneath the pMUT membrane. The frequency variation is further improved by defining the membrane geometry by this sacrificial oxide etch, reducing sensitivity to top-bottom misalignment and dimensional variations of the through-wafer etch that exposes the membrane backside.

BRIEF DESCRIPTION OF THE SEVERAL VIEWS OF THE DRAWING(S)

Aspects of the present disclosure will be more fully understood by reference to the following drawings which are for illustrative purposes only:

DETAILED DESCRIPTION OF THE INVENTION

Although the description herein contains many details, these should not be construed as limiting the scope of the claimed invention but as merely providing illustrations of some of certain embodiments in accordance with aspects of the present disclosure. Therefore, it will be appreciated that the scope of the claimed invention fully encompasses other embodiments, which may become obvious to those skilled in the art.

In the following detailed description, reference is made to the accompanying drawings, which form a part hereof, and in which is shown by way of illustration specific embodiments in which the invention may be practiced. In this regard, directional terminology, such as "top," "bottom," "front," "back," "first," "second," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

This application discloses a micromachined ultrasonic transducer (MUT), in particular a piezoelectric micromachined ultrasonic transducer (pMUT) device comprising a circular membrane embodiment, including air vents at the perimeter of the membrane. It will be appreciated that the following embodiments are provided by way of example only, and that numerous variations and modifications are possible. For example, while circular embodiments are shown, the pMUT membrane may have many different shapes such as square, rectangular, hexagonal, octagonal, and so on. Also, this description is focused on pMUTs having a unimorph construction, consisting of a single piezoelectric layer on a passive layer. Bimorph and multimorph pMUTs having multiple piezoelectric layers and various electrode patterns are possible, and should also be considered. All such variations that would be apparent to one of ordinary skill in the art are intended to fall within the scope of this disclosure. It will also be appreciated that the drawings are not necessarily to scale, with emphasis being instead on the distinguishing features of the bonded wafer pMUT device disclosed herein.

Figure 1:
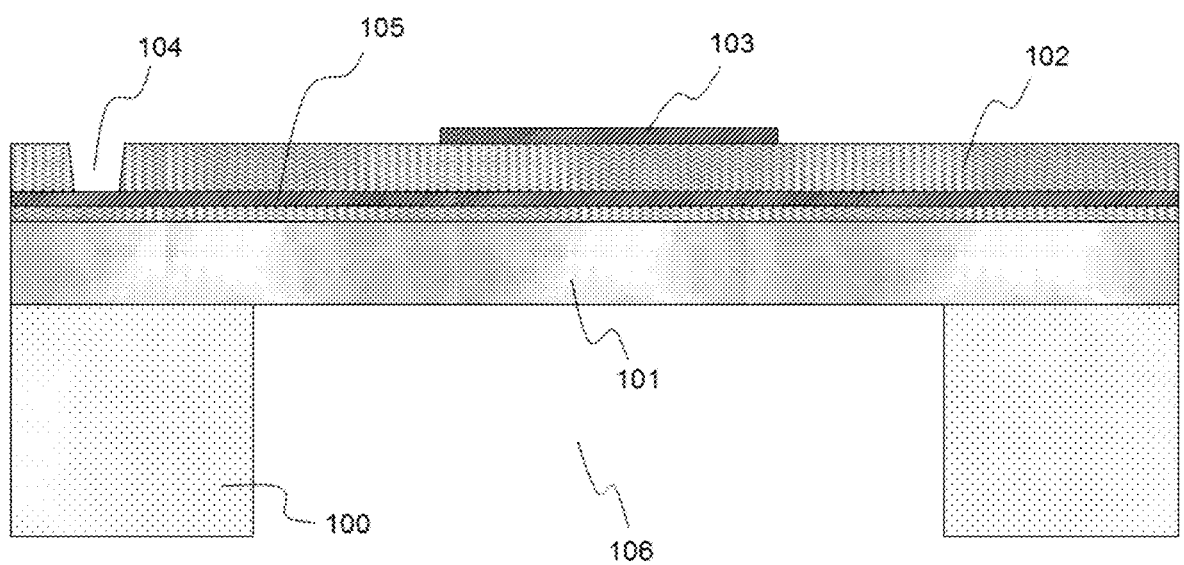
FIG. 1 is a cross section view of a prior art piezoelectric micromachined ultrasonic transducer.
Figure 2A:
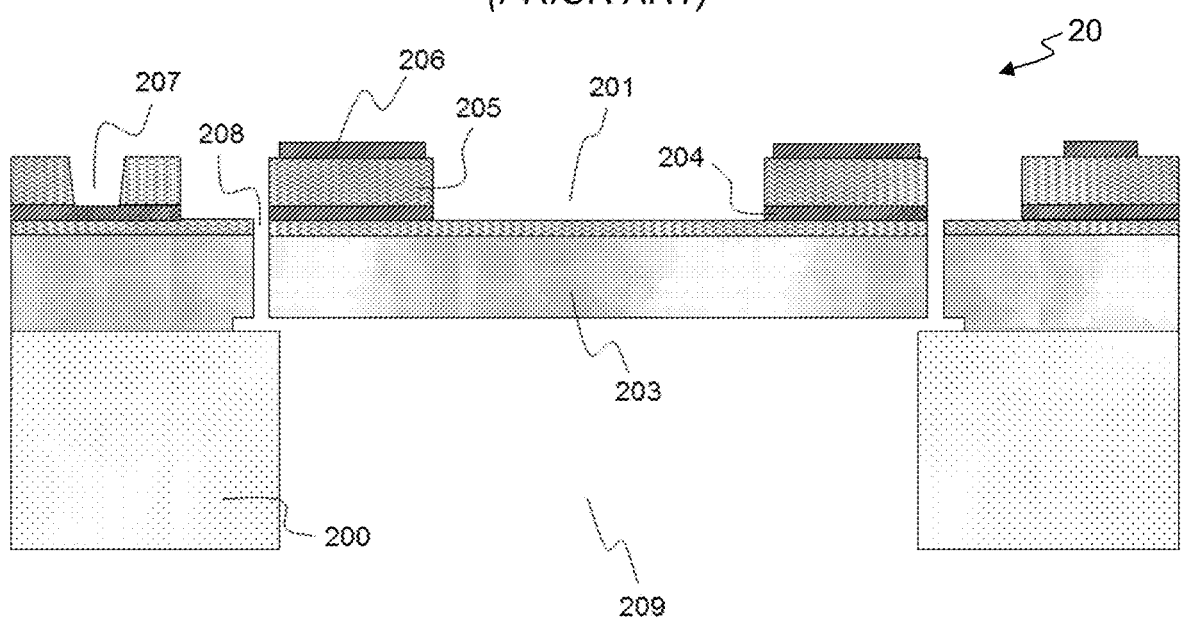
FIG. 2A is a cross section view of the proposed piezoelectric micromachined ultrasonic transducer (pMUT) in accordance with an aspect of the present disclosure.
Figure 2B:
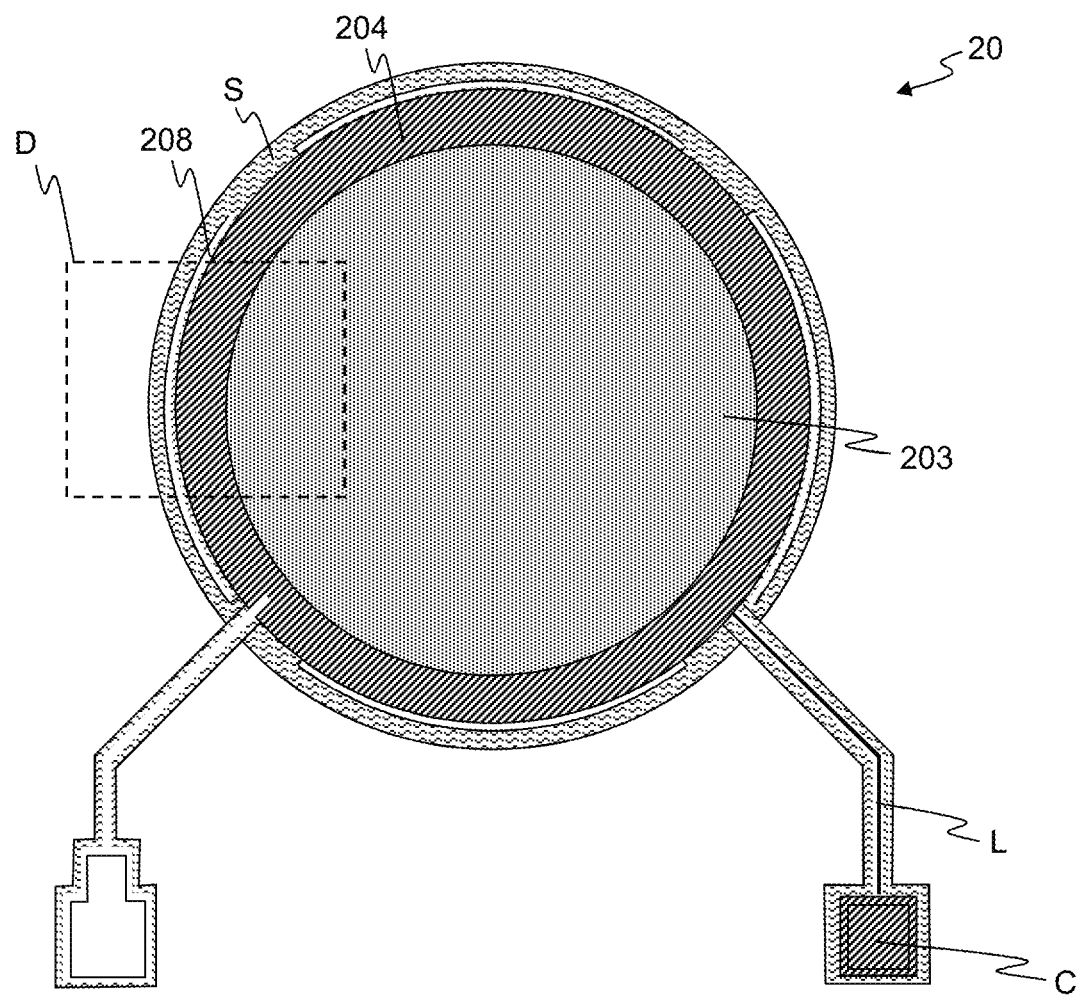
FIG. 2B is a plan view of the pMUT shown in FIG. 2A.
Figure 2C:
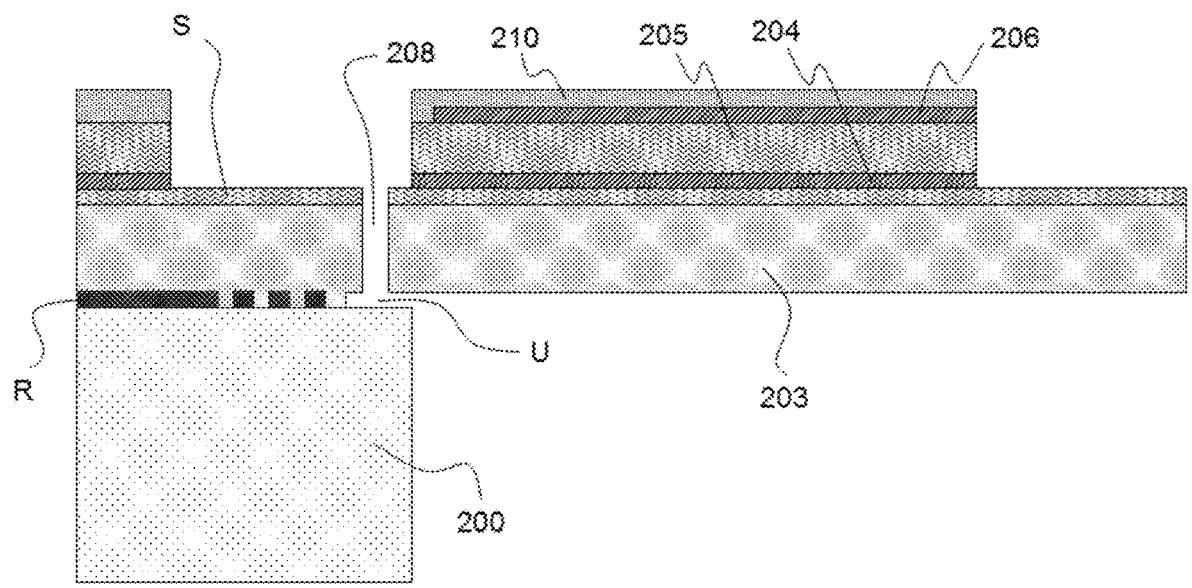
FIG. 2C is a cross section view of a portion of the pMUT indicated in FIG. 2B.
Figure 3:
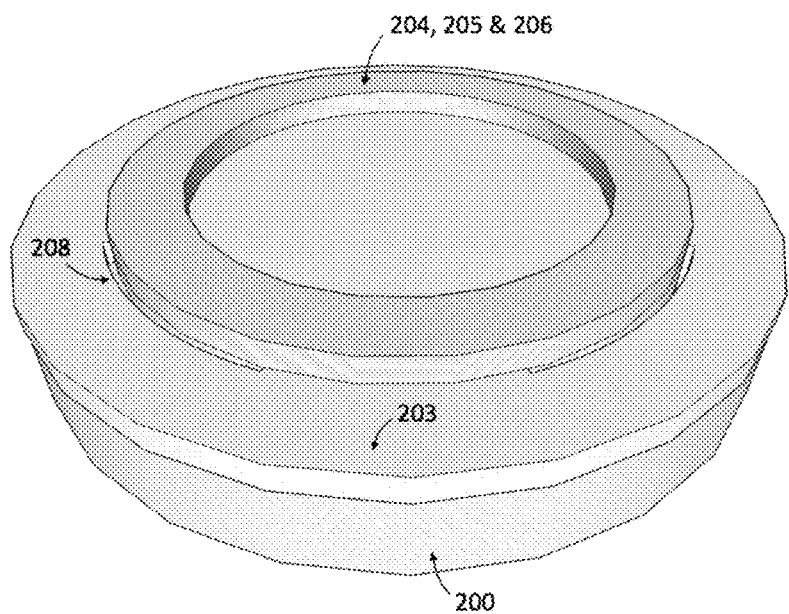
FIG. 3 shows a 3D view of the proposed piezoelectric micromachined ultrasonic transducer of FIGS. 2A-2C.

FIGS. 2A-2C illustrate an embodiment of the proposed pMUT 20 formed by multiple thin-film layers deposited onto a substrate 200. FIG. 3 is a three-dimensional illustration of an embodiment of the proposed pMUT formed by multiple thin-film layers deposited onto a substrate 200. The pMUT 20 shown in FIG. 2A generally includes a membrane layer 203 formed on a sacrificial layer that is formed on a front surface of the substrate 200. A cavity 209 is formed from a back surface of the substrate 200 though the substrate to the membrane layer 203 to define a vibrating portion 201 of the membrane layer 203. A patterned bottom electrode (BE) 204 is formed on the membrane layer 203. In some implementations a seed layer S made of dielectric material is formed on the front side of the membrane layer 203 and the bottom electrode layer 204 is formed on the seed layer, as shown in FIG. 2C.

A piezoelectric layer 205 is formed on the bottom electrode 204 and patterned into a ring shape. The ring-shaped pattern in the piezoelectric layer 205 includes a central opening and one or more contact openings 207 that expose underlying portions of the bottom electrode 204. A top electrode (TE) 206 is formed on an upper surface of a portion of the piezoelectric layer 205 that overlies the vibrating portion 201 of the membrane layer 203. As a result, a portion of the piezoelectric layer 205 is sandwiched between the bottom electrode 204 and top electrode 206. The top and bottom electrodes are also patterned into a ring shape. Because the ring-shaped actuator structure formed by the patterned bottom electrode 204, piezoelectric layer 205, and top electrode 206 is a relatively small fraction of the surface area of the pMUT, the mechanical behavior of the pMUT is dominated by the properties of the membrane layer 203, substantially reducing the effects that plague membranes composed of several different materials with different levels of residual stress, different thermal expansion coefficients, et cetera. Consequently, the mechanical behavior of the pMUT membrane is more similar to that of a membrane composed only of a single material.

Perforations, e.g., slots 208, are formed through the vibrating portion 201 to the cavity at selected locations. The slots 208 help further reduce stress sensitivity in the membrane layer 203 by allowing the membrane to expand or contract to release residual stress. In the illustrated example—FIG. 2C, an undercut U is formed beneath membrane layer 203 over the substrate 200 and intersecting the slots 208. This configuration allows the slots to act as vents for equalizing pressure on opposite sides of the membrane layer 203. In some implementations a passivation layer 210, as shown in FIG. 2C, is formed over the top electrode layer 206 and conductive contacts C to the top electrode are formed in openings in the passivation layer, as shown in FIG. 2B and FIG. 2C. Conductive leads L may electrically connect the contacts C to the electrode layers 204, 206, e.g., as shown in FIG. 2B.

Membrane 203 is attached to substrate 200 at specific anchor points that are defined by patterning a sacrificial oxide layer that is located between the membrane 203 and the substrate 200. The locations of these anchors determine the mechanical behavior of the membrane, in particular the anchor locations determine the resonant frequency of the membrane. In this way, the dimensions of membrane 203 can be determined independently of the dimensions of cavity 209. This allows the mechanical behavior of the membrane, including its resonant frequency, to be defined independently of the dimensions of the cavity 209, which may be defined based on desired acoustic properties. In some implementations, the anchors may be patterned such that rings of dielectric material R may be formed between the substrate 200 and the membrane layer 203, as shown in FIG. 2C.

The dimension and pitch of slots 208 can also be designed to enable the sacrificial oxide to be removed by a hydrofluoric acid (HF) etch in a desired amount of time. Without these slots, the HF etch must travel the full distance of undercut U. The undercut distance U may vary significantly across a wafer and from wafer-to-wafer since this distance is determined by the dimensions and alignment of cavity 209 with the front-side anchors of membrane 203. Using front-side slots 208 to determine the undercut distance U significantly reduces the variation in this dimension, thereby reducing the time required for the HF etch to release membrane 203.

Non-limiting examples of materials and values for various dimensions shown in FIG. 2A, FIG. 2B and FIG. 2C are listed in Table I below.

TABLE I

Standard dimensions:

| Dimension | Description | Units | Range |
|---|---|---|---|
| 200 | Substrate (silicon) thickness | μm | [100, 900] |
| 203 | Membrane elastic layer 203 thickness | μm | [1, 40] |
| 204 | Bottom electrode layer thickness | nm | [100, 500] |
| 205 | Piezoelectric layer thickness | μm | [0.5, 4] |
| 206 | Top electrode layer thickness | nm | [100, 500] |
| 208 | Air vent slot width | μm | [1, 8] |
| 210 | Passivation layer | μm | [0.2, 1] |
| R | Undercut thickness | μm | [0.2, 3] |
| U | Undercut U width | μm | [4, 12] |
| 209 | Cavity diameter | μm | [300, 3000] |

Figure 4A:
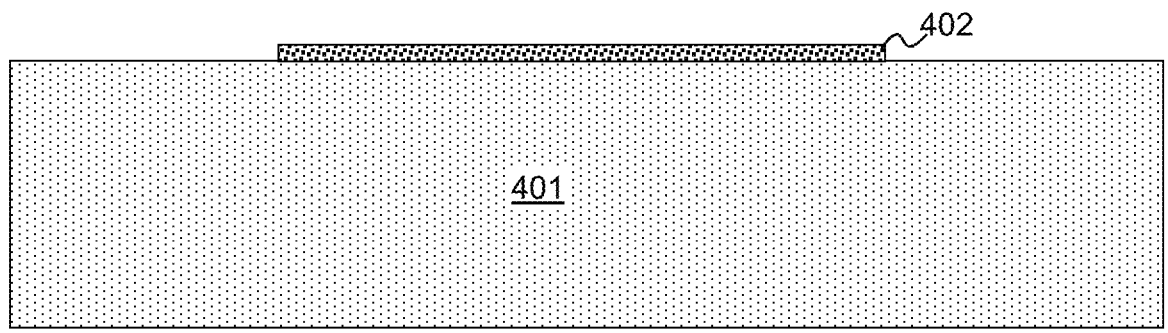
FIGS. 4A-4K illustrate the steps of forming a pMUT in accordance with one embodiment.

The steps in forming a pMUT in accordance with FIG. 2A and FIG. 3 are illustrated and described in FIGS. 4A to 4K. The process begins as shown in FIG. 4A with a silicon substrate 401 that is coated with a silicon dioxide ("oxide") layer 402. Oxide layer 402 may be deposited by various means including thermal oxidation, chemical vapor deposition (CVD) and plasma-enhanced CVD (PECVD). Oxide layer 402 functions as an etch-stop layer for a subsequent deep reactive ion etching (DRIE) process step and as a sacrificial release layer during a subsequent hydrofluoric acid (HF) or vapor HF etching phase. The oxide layer 402 is lithographically patterned and etched to define anchors 403 that connect the pMUT membrane to substrate 401.

Figure 4B:
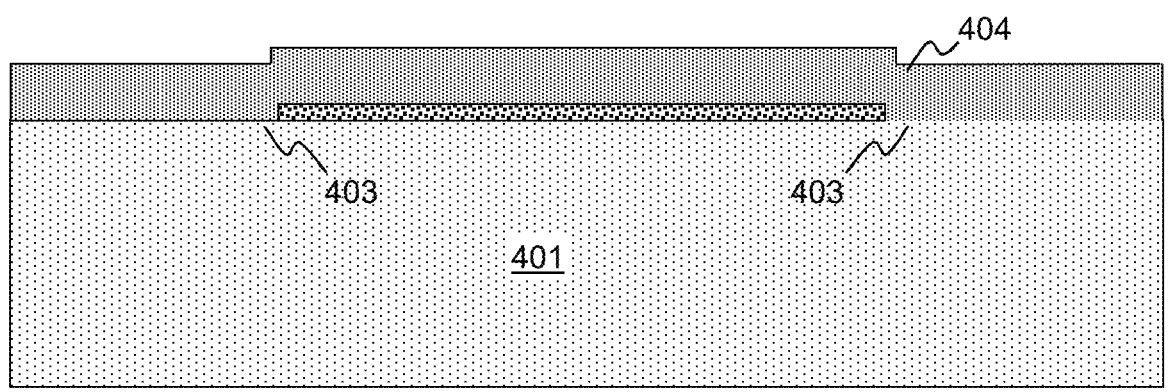
Figure 4C:
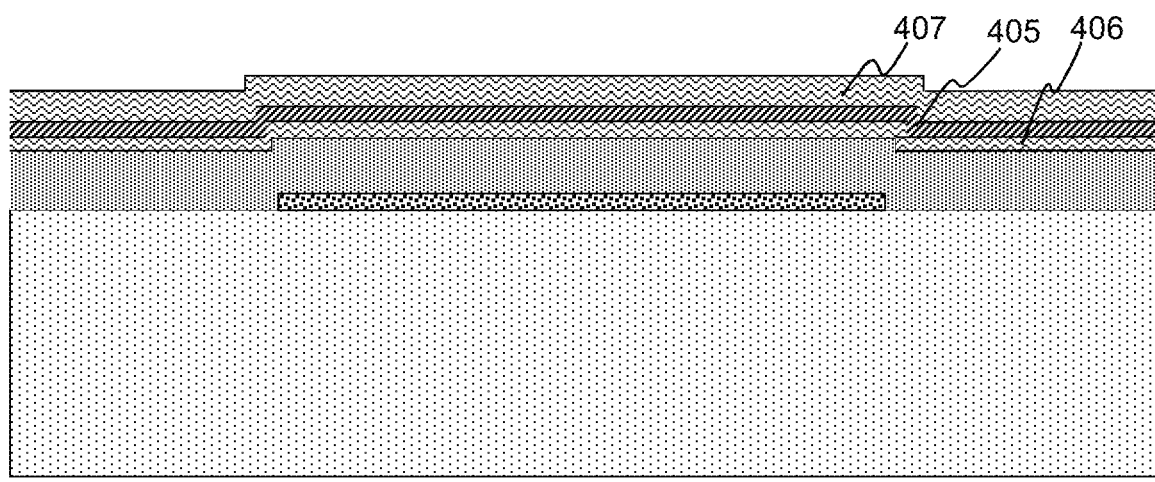

A polysilicon layer 404 is then deposited, as shown in FIG. 4B. Polysilicon layer 404 forms the elastic layer of the pMUT membrane. The surface of polysilicon layer 404 is polished by chem-mechanical polishing (CMP) to produce a smooth surface for subsequent piezoelectric layer deposition. FIG. 4C shows a metal bottom electrode (BE) layer 405 which is then deposited on top of polysilicon layer 404. BE layer 405 may be electrically isolated from polysilicon layer 404 using a thin dielectric layer 406 between BE layer 405 and polysilicon layer 404. A piezoelectric layer 407 is then deposited on top of BE layer 405. In an embodiment, dielectric layer 406 is sputtered AlN with a thickness of 10 nm to 1000 nm, BE layer 405 is Mo, Al, or Pt, with a thickness of 100 nm to 500 nm, and piezoelectric layer 407 is AlN with a thickness of 500 nm to 2000 nm. Other materials may be used for dielectric layer 406, such as $SiO_2$ and $Si_3N_4$, and other materials may be used for piezoelectric layer 407, such as ZnO, PZT, and KNN. In some embodiments, it may be desirable for BE layer 405 to be electrically connected to polysilicon layer 404, in which case dielectric layer 406 may be eliminated. In another embodiment, polysilicon layer 404 can be doped using various impurities so that polysilicon layer 404 is conductive, in which case BE layer 405 and dielectric layer 406 may both be eliminated and the substrate may provide the function of the BE layer 405.

Figure 4D:
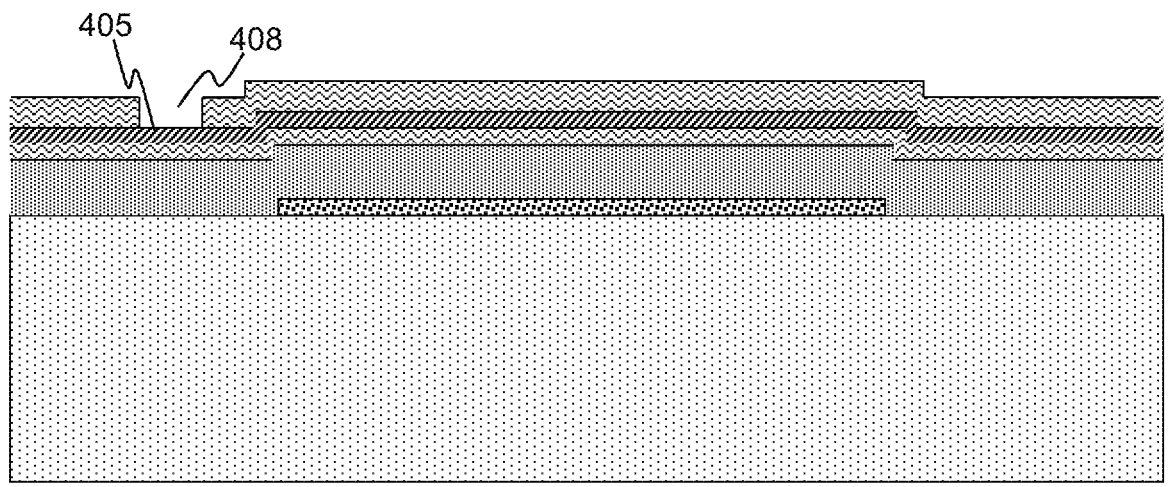
Figure 4E:
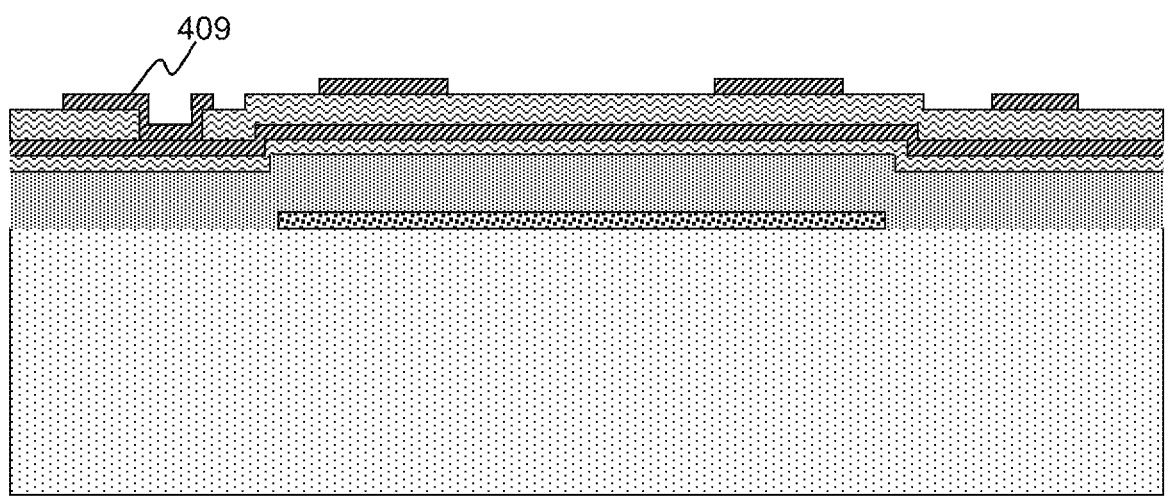
Figure 4F:
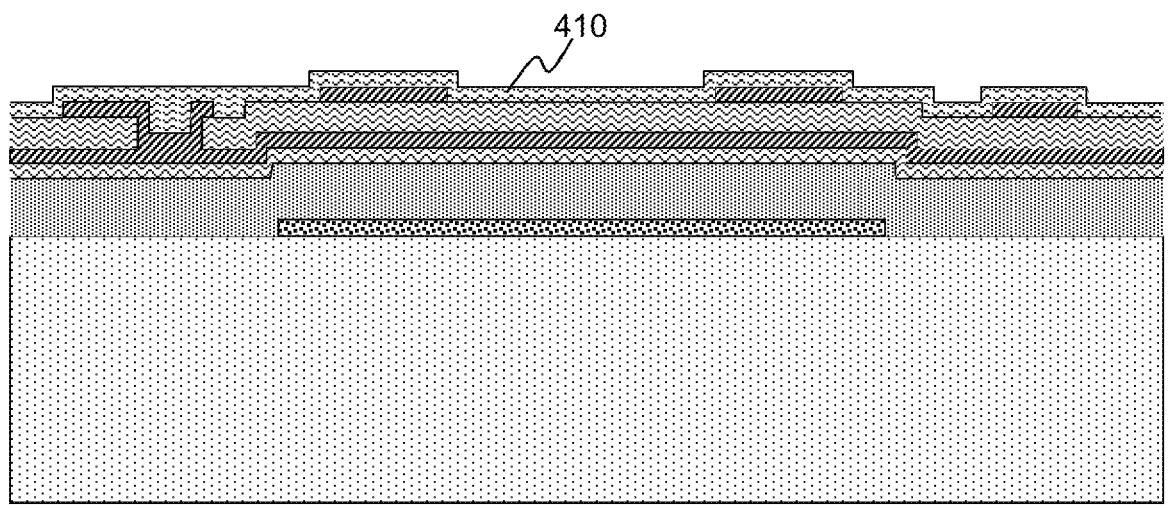
Figure 4G:
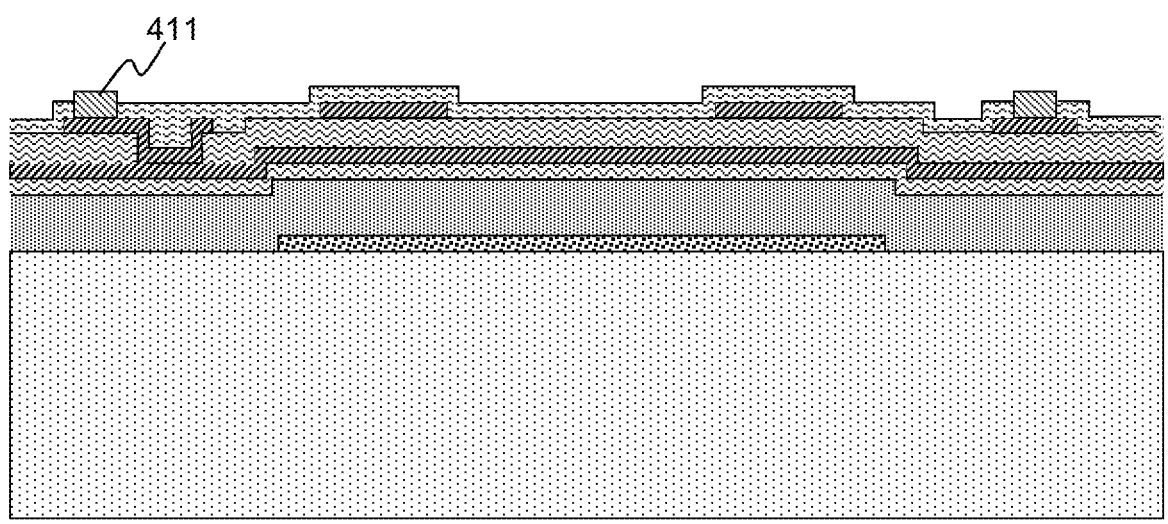
Figure 4H:
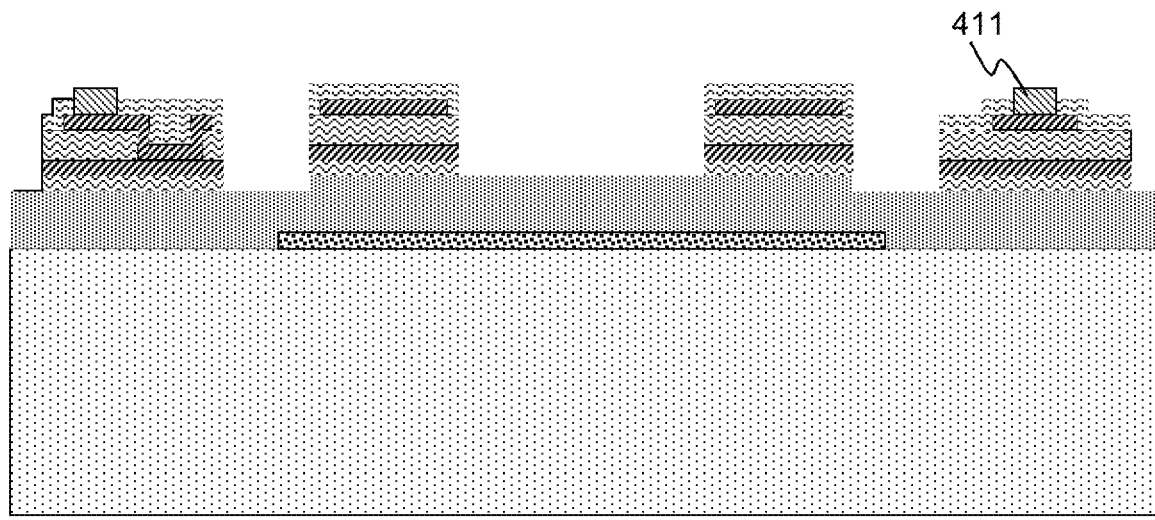
Figure 4I:
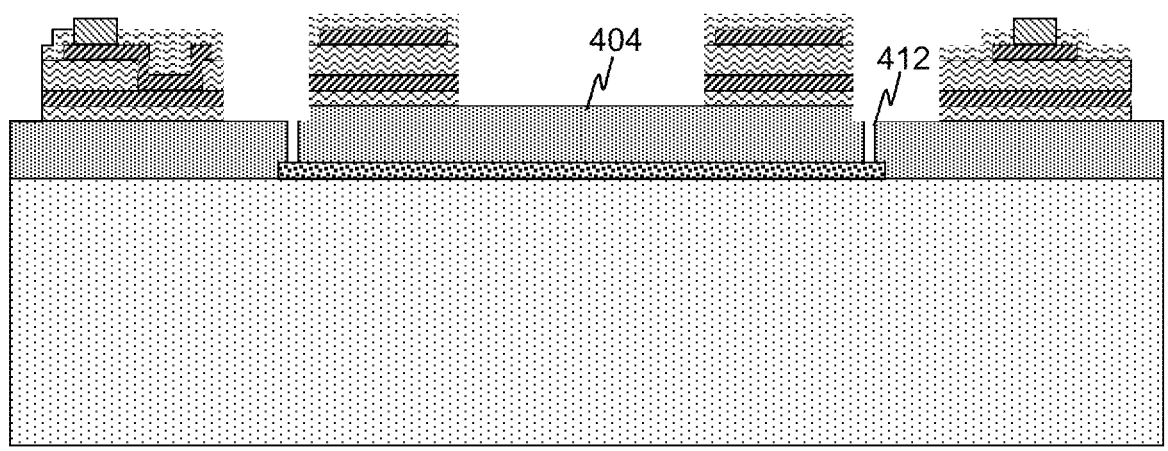
Figure 4J:
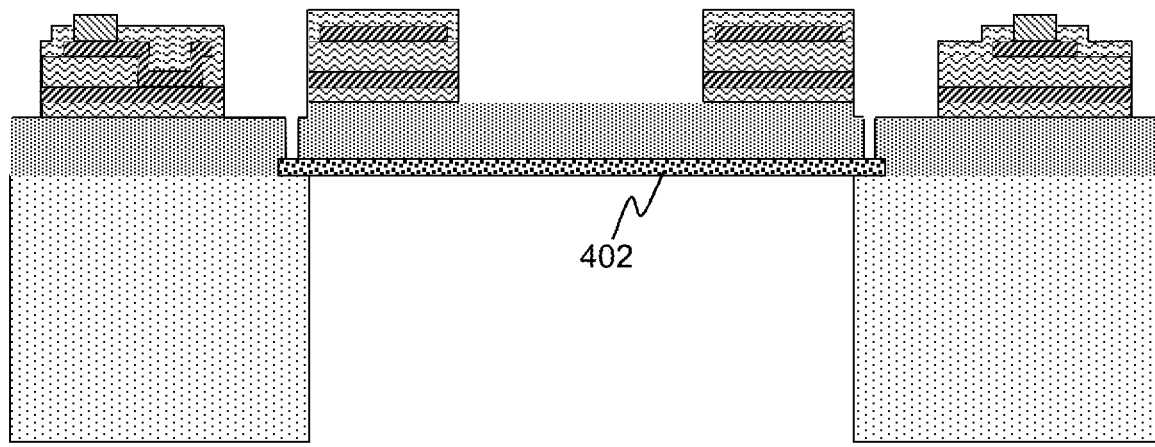
Figure 4K:
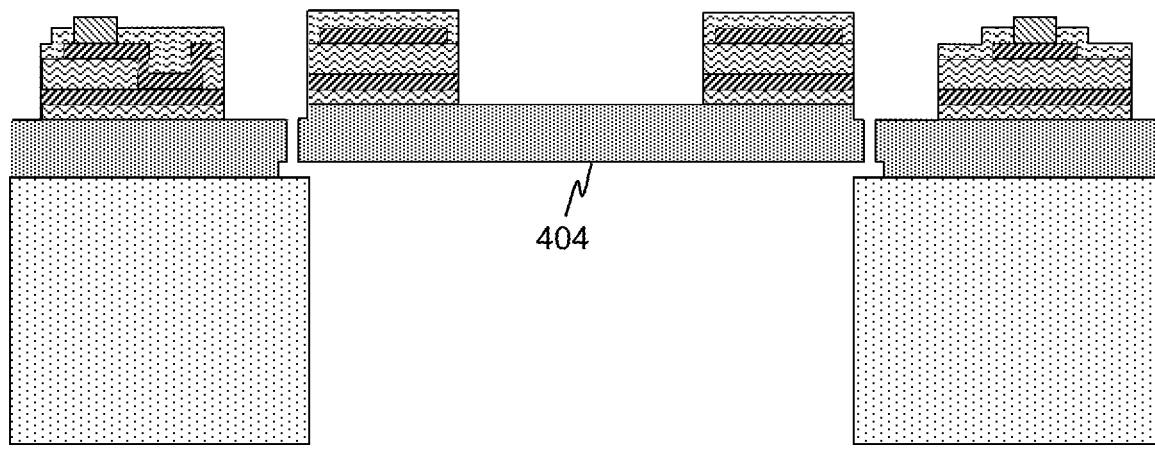

FIG. 4D shows that vias 408 are etched through piezoelectric layer 407 to expose BE layer 405, allowing electrical connection to this layer. A top electrode (TE) metal layer 409 is deposited on top of the piezoelectric layer to form a ring shaped top electrode, as shown in FIG. 4E. The TE metal layer 409 may be deposited through a mask or formed as a continuous layer and then subjected to lithography and etch to form the ring shape. In an embodiment, TE layer 409 is Mo deposited via sputtering with a thickness of 100 nm to 1000 nm. A passivation layer 410 is then deposited, as depicted in FIG. 4F, and openings are etched to expose TE layer 409. Various dielectric materials may be used for passivation layer 410 including for example silicon nitride, silicon oxy-nitride, and AlN. In some embodiments, passivation layer 410 may be eliminated. Metal is deposited and patterned to form bond-pads 411, FIG. 4G. The multilayer stack consisting of passivation layer 410, piezoelectric layer 407 and BE layer 405, and dielectric layer 406 is etched, stopping on polysilicon layer 404, FIG. 4H. Alternatively, depending on microfabrication capability, the aforementioned etch can stop the etch at the dielectric layer 406. Polysilicon layer 404 (and eventually the dielectric layer 406) is etched to produce slots 412, stopping on oxide layer 402, as seen in FIG. 4I. The back side of substrate 401 is lithographically patterned and etched via DRIE, stopping on oxide layer 402, as shown in FIG. 4J. Finally, oxide layer 402 is etched, e.g., using HF or vapor HF to release the pMUT membrane, as seen in FIG. 4K. The dimension and pitch of slots 412 may be designed to enable the HF or vapor HF etch to undercut the sacrificial oxide layer in a desired time.

Figure 5:
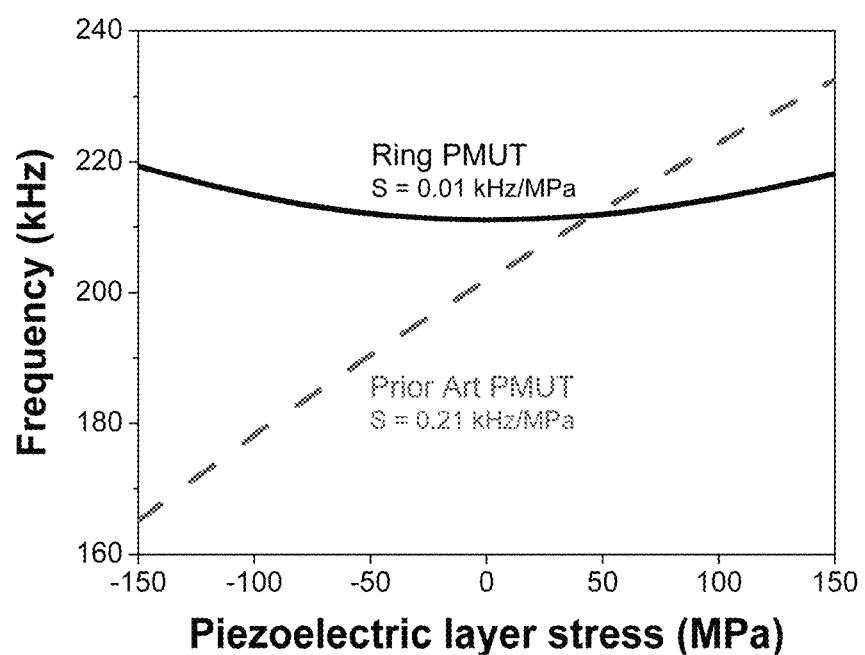
FIG. 5 shows the natural frequency variation as a function of the piezoelectric layer residual stress in accordance with one embodiment.

The proposed design enables several advantages with respect to the prior art pMUTs. The device-to-device variation in resonance frequency is largely reduced by the following design features:

(i) Relative to conventional PMUT structures, the stress present in the piezoelectric layer has much less effect on resonance frequency. The proposed design depicts a pMUT membrane with a ring-shaped piezoelectric layer. This geometry enables the removal of the piezoelectric layer in the center of the membrane. Removing this section of material not only reduces the stress sensitivity, but also improves the bandwidth of the transducer, since the total membrane mass is reduced without considerably changing the membrane stiffness. FIG. 5 shows the results of a finite element method (FEM) model of the pMUTs natural frequency versus the residual stress in the piezoelectric layer obtained for the following pMUT layer structure and dimensions: TE layer (409)—Mo (0.2 μm)/piezoelectric layer (407)—AlN (1.5 μm)/BE layer (405)—Mo (0.2 μm)/polysilicon layer (404)—(4.5 μm).

Figure 6:
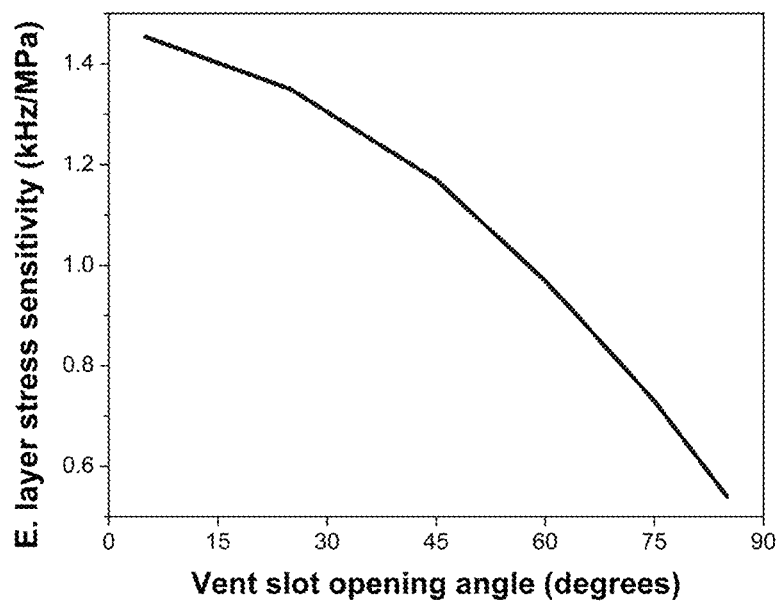
FIG. 6 shows the sensitivity of the natural frequency to stress in the elastic layer as a function of the slot angular length size, with a width of 3 μm.
Figure 7:
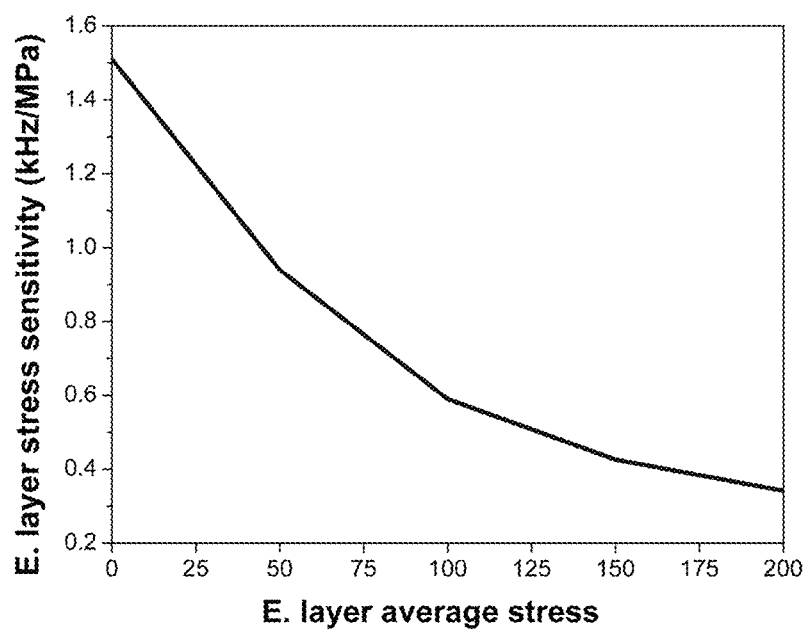
FIG. 7 shows the sensitivity of the natural frequency to stress in the elastic layer as a function of the average residual stress on the elastic layer.

(ii) The air vent slots opened in the perimeter of the pMUT membrane work as a stress reliever. The longer the slots are, the shorter the correspondent membrane anchors, and the lower the sensitivity of the natural frequency to residual stress in the polysilicon layer. FIG. 6 shows the stress sensitivity as a function of arc angle of four identical air vent slots, again obtained by FEM using the layers and thicknesses described in (i) above (iii) An additional approach to reduce the stress sensitivity is to use a polysilicon layer 404 with an average tensile residual stress. FIG. 7 shows how the stress sensitivity decreases with increasing tensile residual stress in the polysilicon layer.

(iv) Relative to prior art, the use of a sacrificial oxide layer 402 and anchors 403 allow more precise definition of the pMUT membrane's dimensions, thereby reducing device-to-device variations in natural frequency and acoustic pressure sensitivity. In prior art pMUTs, resonance frequency and acoustic pressure sensitivity variation arises from bad alignment of the back-side etch to the features on the front side of the wafer or from variations in the diameter of this backside etch. For the prior art pMUT design, the misalignment between the top electrode and the backside etch can be as large as 10 microns, while the etched diameter can vary by over 10 microns. In the proposed design the membrane dimensions are defined by the locations of the anchors and the extent of the sacrificial oxide layer, both of which are defined by front-side lithography and etching, processes which have resolution and alignment on the order of 1 micron, an order of magnitude better than prior art.

Figure 8A:
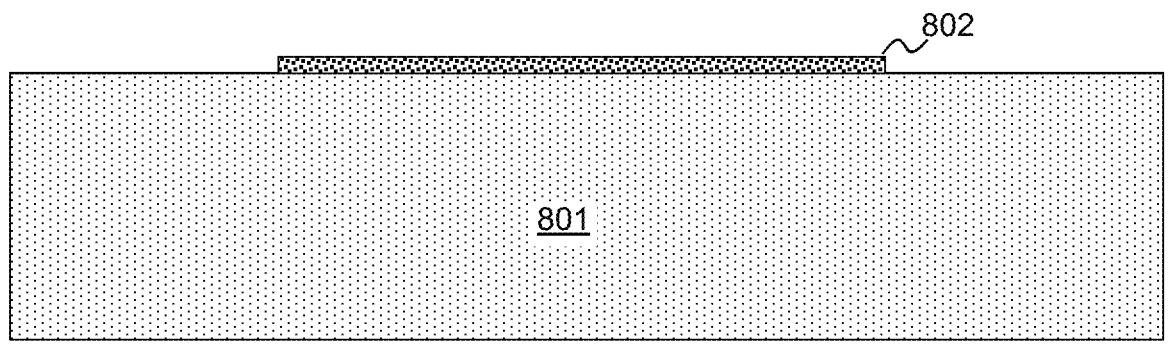
FIGS. 8A-8K illustrate the steps of forming a pMUT in accordance with an additional embodiment.

In another embodiment, the pMUTs elastic layer is formed by two polysilicon layers separated by a silicon nitride layer. In this embodiment, the second polysilicon layer can be patterned to remove mass or modify the stiffness of the pMUT membrane, thereby achieving a desired natural frequency, bandwidth, and stress sensitivity. The steps in forming a pMUT in accordance with this embodiment are illustrated and described in FIGS. 8S to 8K. The process begins as shown in in FIG. 8A, with a silicon substrate 801 that is coated with a silicon dioxide ("oxide") layer 802. Oxide layer 802 may be deposited by various means including thermal oxidation, chemical vapor deposition (CVD) and plasma-enhanced CVD (PECVD). Oxide layer 802 functions as an etch-stop layer for a subsequent deep reactive ion etching (DRIE) process step and as a sacrificial release layer during a subsequent hydrofluoric acid (HF) or vapor HF etching phase. The oxide layer 802 is lithographically patterned and etched to define anchors 803 that connect the pMUT membrane to substrate 801.

Figure 8B:
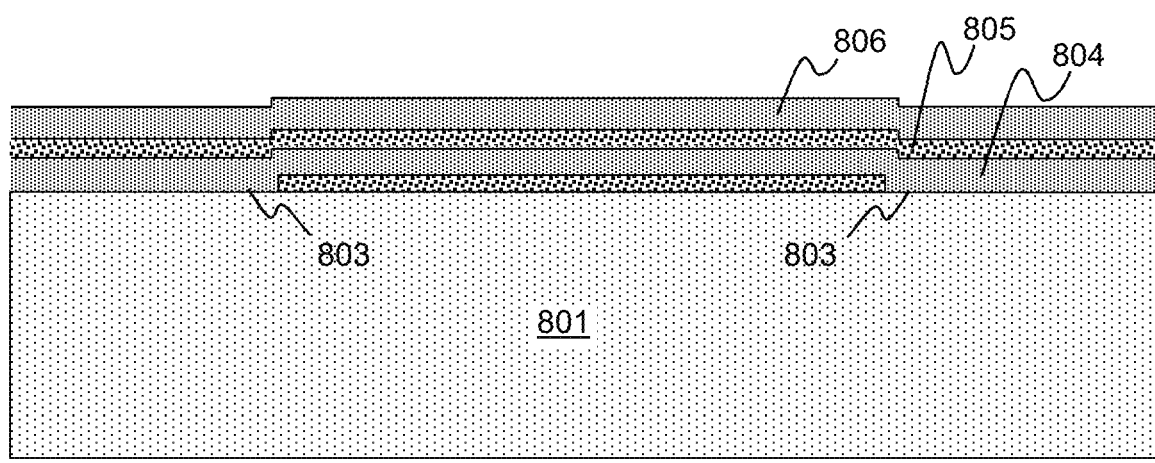
Figure 8C:
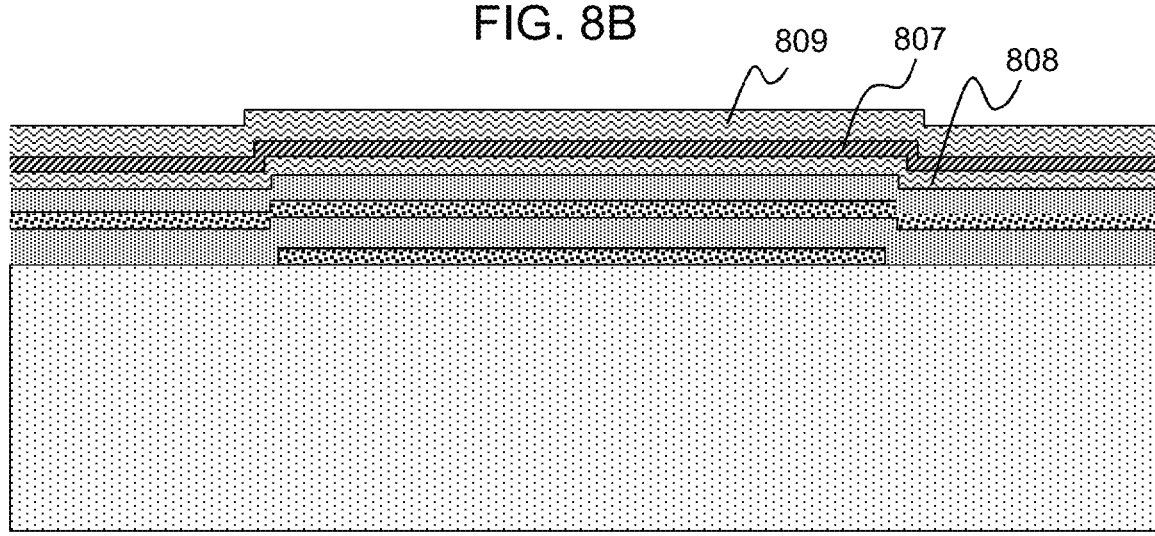

A first polysilicon layer 804, a silicon nitride layer 805, and a second polysilicon layer 806 are then deposited, as shown in FIG. 8B. These three layers form the elastic layer of the pMUT membrane. The thickness of the two polysilicon layers and the silicon nitride layer can be adjusted to achieve desired characteristics, such as pressure sensitivity, natural frequency, stress sensitivity, and bandwidth. The surface of polysilicon layer 806 is polished by chem-mechanical polishing (CMP) to produce a smooth surface for subsequent piezoelectric layer deposition. FIG. 8C shows a metal bottom electrode (BE) layer 807 is then deposited on top of polysilicon layer 806. BE layer 807 may be electrically isolated from polysilicon layer 806 using a thin dielectric layer 808 between BE layer 807 and polysilicon layer 806. A piezoelectric layer 809 is then deposited on top of BE layer 807. In an embodiment, dielectric layer 808 is sputtered AlN with a thickness of 10 nm to 1000 nm, BE layer 807 is Mo, Al, or Pt, with a thickness of 100 nm to 500 nm, and piezoelectric layer 809 is AlN with a thickness of 500 nm to 2000 nm. Other materials may be used for dielectric layer 808, such as SiO2 and Si3N4, and other materials may be used for piezoelectric layer 809, such as ZnO, PZT, and KNN. In some embodiments, it may be desirable for BE layer 807 to be electrically connected to polysilicon layer 806, in which case dielectric layer 808 may be eliminated. In another embodiment, polysilicon layer 806 can be doped using various impurities so that polysilicon layer 806 is conductive, in which case BE layer 807 and dielectric layer 808 may both be eliminated.

Figure 8D:
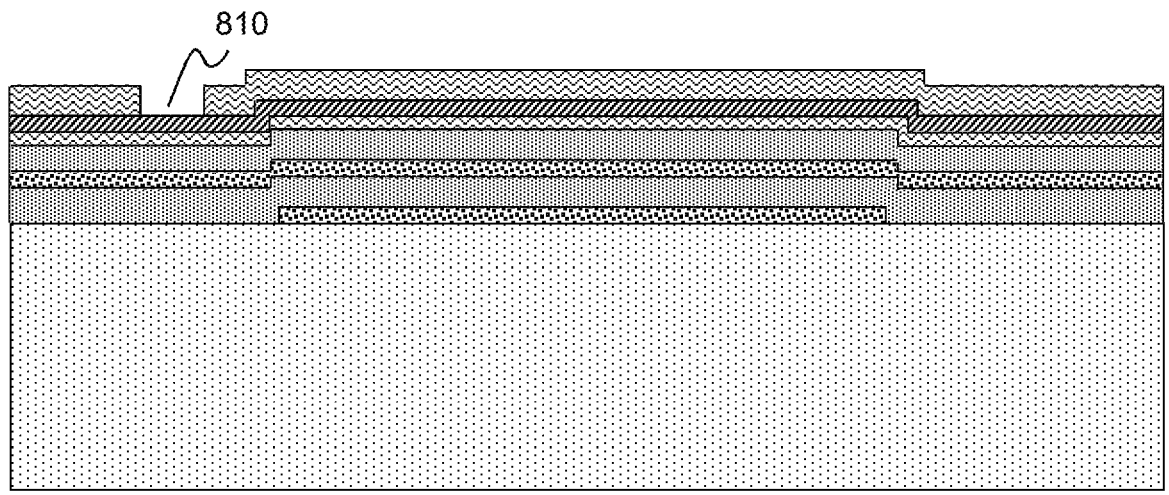
Figure 8E:
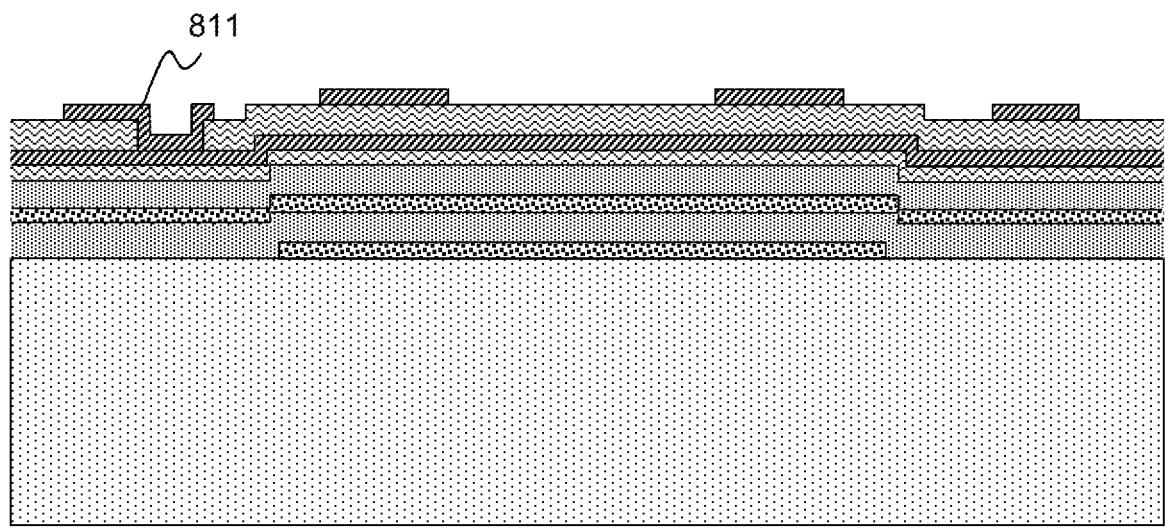
Figure 8F:
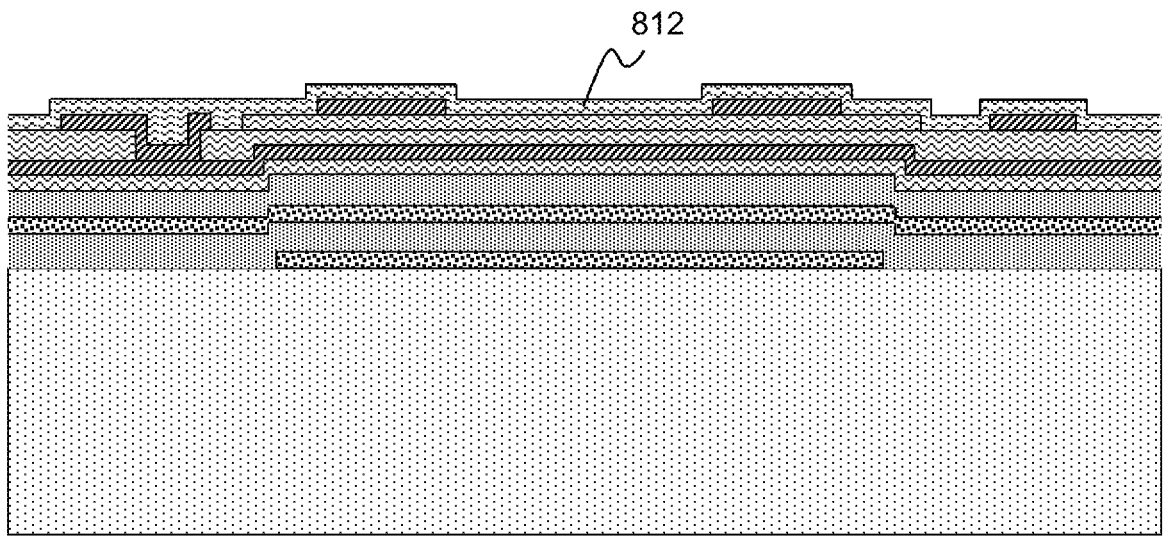
Figure 8G:
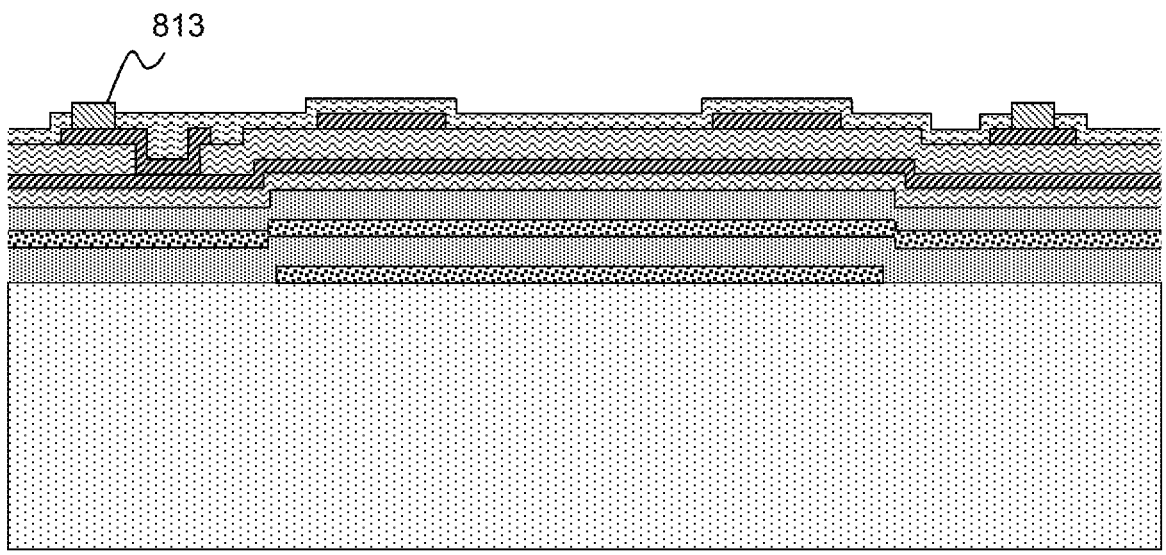
Figure 8H:
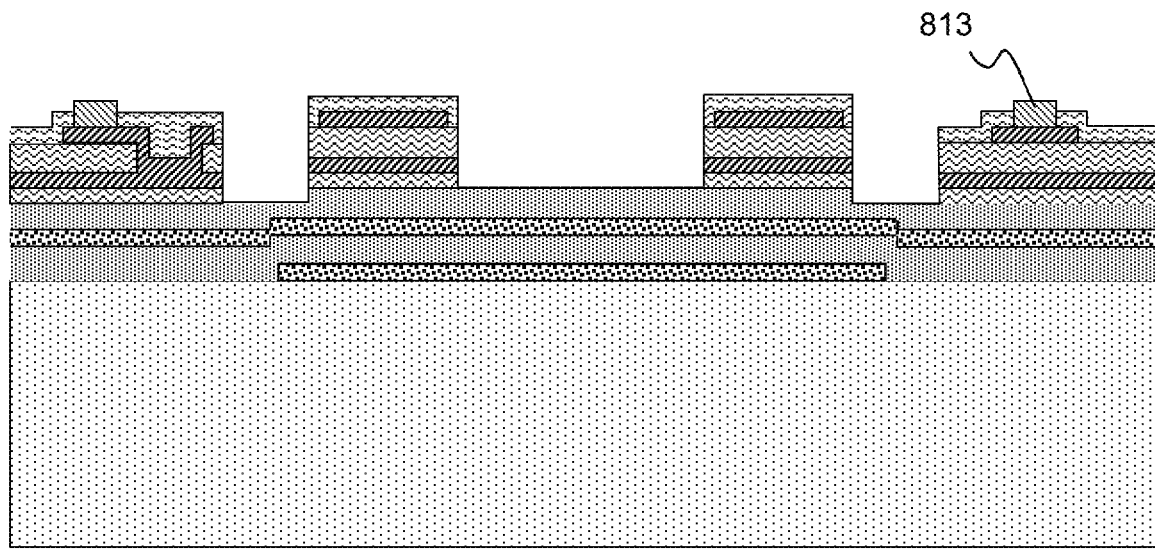
Figure 8I:
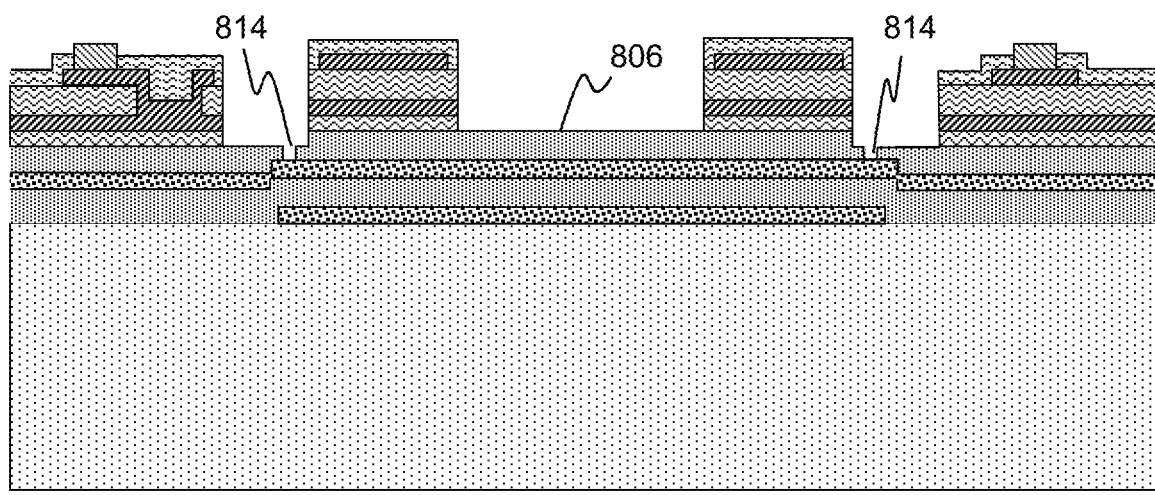

FIG. 8D shows that vias 810 are etched through piezoelectric layer 809 to expose BE layer 807, allowing electrical connection to this layer. A top electrode (TE) metal layer 811 is deposited on top of the piezoelectric layer, as seen in FIG. 8E. In some embodiments, TE layer 811 is Mo deposited via sputtering with a thickness of 100 nm to 1000 nm. A passivation layer 812 is then deposited, as shown in FIG. 8F, and openings are etched to expose TE layer 811. Various dielectric materials may be used for passivation layer 812 including for example silicon nitride, silicon oxy-nitride, and AlN. In some embodiments, passivation layer 812 may be eliminated. Metal is deposited and patterned to form bond-pads 813, as seen in FIG. 8G. The multilayer stack consisting of passivation layer 812, piezoelectric layer 809, BE layer 807, and dielectric layer 808 is etched, stopping on polysilicon layer 806, FIG. 8H. Polysilicon layer 806 is selectively etched to produce slots 814, stopping on silicon nitride layer 805, as depicted in FIG. 8I. The slots 814 in polysilicon layer 806 can be defined in order to adjust the stiffness and mass of the pMUT's elastic layer, thereby achieving a desired bandwidth, operating frequency, and stress sensitivity. By employing a selective etch that removes polysilicon layer 806 while stopping on silicon nitride layer 807, the depth of slots 814 can be precisely controlled, ensuring accurate dimensional control across a wafer and across a number of different wafers.

Figure 8J:
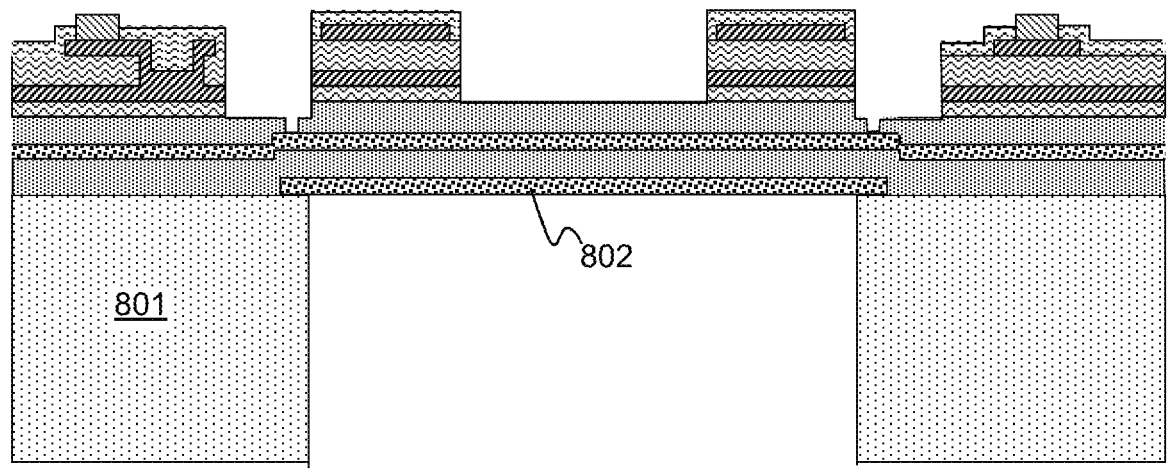
Figure 8K:
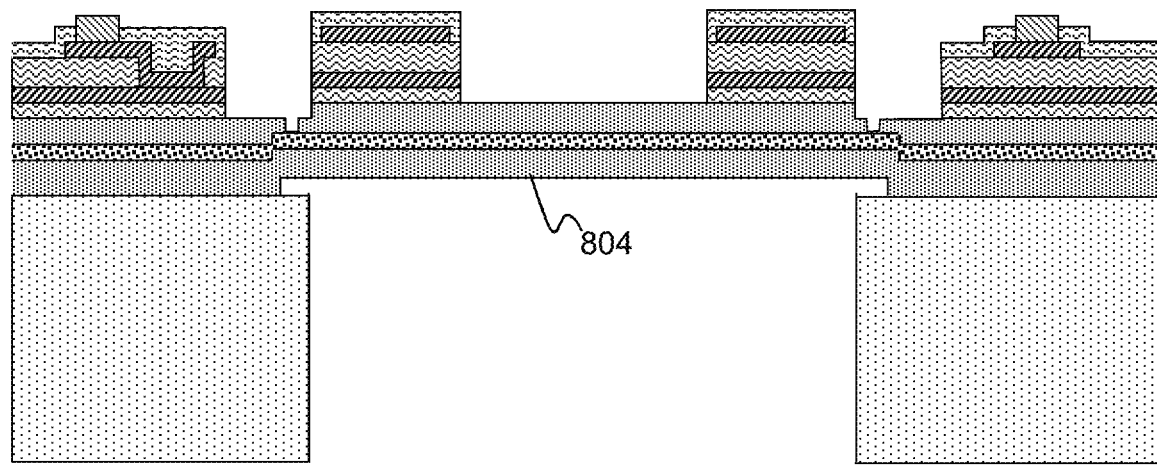

The back side of substrate 801 is lithographically patterned and etched via DRIE, stopping on oxide layer 802, as illustrated in FIG. 8J. Finally, oxide layer 802 is etched using HF or vapor HF to release the pMUT membrane, as shown in FIG. 8K.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

The particular implementations disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(a). In particular, the use of "step of" in the claims herein is not intended to invoke the provisions of 35 USC § 112(a).

What is claimed is:

1. A micromachined ultrasonic device, comprising:
a substrate having an opening formed therethrough;
a membrane layer attached to the substrate over the opening, a portion of the membrane layer that overlies the opening defining a vibrating region of the membrane layer wherein the membrane layer includes an undercut on a side opposite a side on which the actuating structure is formed, wherein a width of the undercut is larger than a width of the opening;
an actuating structure attached to the membrane layer, the actuating structure including a piezoelectric layer sandwiched between first and second electrodes, wherein the piezoelectric layer does not cover selected portions of the membrane layer; and
two or more slots formed in the membrane layer, wherein the two or more slots extend through the membrane layer to intersect the undercut in the membrane layer and are configured to allow the membrane layer to expand or contract to release a residual stress in the membrane layer.

2. The device of claim 1, wherein the membrane layer is attached to the substrate at specific anchor points.

3. The device of claim 1, wherein the locations of the specific anchor points determine mechanical behavior of the membrane layer.

4. The device of claim 1, wherein the locations of the specific anchor points determine a resonant frequency of the membrane.

5. The device of claim 1, wherein the two or more slots provide pressure equalization between the front and back sides of the membrane.

6. The device of claim 1, wherein the actuating structure including a piezoelectric layer sandwiched between first and second electrodes is patterned to reduce the membrane mass without considerably reducing the membrane stiffness.

7. The device of claim 1, wherein the actuating structure including a piezoelectric layer sandwiched between first and second electrodes is patterned into a ring-shaped structure.

8. The device of claim 1, wherein the membrane layer is polysilicon.

9. The device of claim 8, wherein the polysilicon layer has an average tensile residual stress.

10. The device of claim 8, wherein the membrane layer is composed of doped polysilicon and functions as the first electrode layer, such that the actuating structure includes a piezoelectric layer sandwiched between the polysilicon membrane and a second electrode layer.

11. The device of claim 1, wherein the piezoelectric layer is aluminum nitride or PZT.

12. The device of claim 1, wherein the membrane layer includes a layer of silicon nitride sandwiched between a first layer of polysilicon and a second layer of polysilicon.

13. The device of claim 12, wherein the two or more slots extend through the first polysilicon layer to the silicon nitride layer.

14. A method for making a micromachined ultrasonic device, comprising:
forming a membrane layer on a front side of a substrate;
forming an actuating structure on the membrane layer, the actuating structure including a piezoelectric layer sandwiched between first and second electrodes, wherein the piezoelectric layer does not cover selected portions of the membrane layer;
forming an opening in the substrate to a back side of the membrane layer, whereby a portion of the membrane layer that overlies the opening defining a vibrating region of the membrane layer and characterized in:
forming two or more slots in the membrane layer wherein the two or more slots extend through the membrane layer to intersect an undercut in the membrane layer; and are configured to allow the membrane layer to expand or contract to release a residual stress in the membrane layer; and
forming an undercut in the membrane layer on a backside of the membrane layer opposite the front side, wherein a width of the undercut is larger than a width of the opening.

15. The method of claim 14, wherein forming the membrane layer on the front side of the substrate includes attaching the membrane layer to the substrate at specific anchor points.

16. The method of claim 15, wherein attaching the membrane layer to the substrate at the specific anchor points includes defining the specific anchor points by patterning a sacrificial oxide layer that is located between the membrane and the substrate.

17. The method of claim 15, wherein the locations of the specific anchor points determine mechanical behavior of the membrane layer.

18. The method of claim 15, wherein the locations of the specific anchor points determine a resonant frequency of the membrane.

19. The method of claim 14, wherein the actuating structure including a piezoelectric layer sandwiched between first and second electrodes is patterned to reduce the membrane mass without considerably reducing the membrane stiffness.

20. The method of claim 19, wherein the actuating structure including a piezoelectric layer sandwiched between first and second electrodes is patterned into a ring-shaped structure.

21. The method of claim 14, wherein the membrane layer is polysilicon.

22. The method of claim 21, wherein the polysilicon layer has an average tensile residual stress.

23. The method of claim 14, wherein the piezoelectric layer is aluminum nitride or PZT.

24. The method of claim 21, forming the first electrode includes doping the polysilicon layer of the membrane, such that the actuating structure includes a piezoelectric layer sandwiched between the polysilicon membrane and a second electrode layer.

25. The method of claim 14, wherein the membrane layer is formed by:
depositing a first layer of polysilicon;
depositing a layer of silicon nitride; and
depositing a second layer of polysilicon.

26. The method of claim 25, wherein the two or more slots extend through the first polysilicon layer to the silicon nitride material.

* * * * *